(12) United States Patent
Takaishi et al.

(10) Patent No.: US 7,998,867 B2
(45) Date of Patent: Aug. 16, 2011

(54) METHOD FOR MANUFACTURING EPITAXIAL WAFER

(75) Inventors: Kazushige Takaishi, Tokyo (JP); Tomonori Miura, Tokyo (JP)

(73) Assignee: Sumco Corporation, Tokyo (JP)

(*) Notice: Subject to any disclaimer, the term of this patent is extended or adjusted under 35 U.S.C. 154(b) by 0 days.

(21) Appl. No.: 12/740,441

(22) PCT Filed: Nov. 6, 2008

(86) PCT No.: PCT/JP2008/070236
§ 371 (c)(1),
(2), (4) Date: Jun. 2, 2010

(87) PCT Pub. No.: WO2009/060913
PCT Pub. Date: May 14, 2009

(65) Prior Publication Data
US 2010/0261341 A1    Oct. 14, 2010

(30) Foreign Application Priority Data

Nov. 8, 2007  (JP) ................................. 2007-291339

(51) Int. Cl.
*H01L 21/302* (2006.01)
*H01L 21/461* (2006.01)

(52) U.S. Cl. .................. 438/691; 438/692; 257/618

(58) Field of Classification Search .................. 438/690, 438/478, 480, 737, 743, 691, 692, 704; 257/618
See application file for complete search history.

(56) References Cited

U.S. PATENT DOCUMENTS

| 4,925,809 | A | * | 5/1990 | Yoshiharu et al. | 117/106 |
| 5,989,985 | A | * | 11/1999 | Maruyama et al. | 438/507 |
| 6,294,019 | B1 | * | 9/2001 | Miura et al. | 117/96 |
| 2009/0302432 | A1 | | 12/2009 | Ono | |
| 2009/0321874 | A1 | | 12/2009 | Aoki et al. | |
| 2010/0003811 | A1 | | 1/2010 | Wada | |
| 2010/0151692 | A1 | | 6/2010 | Ono et al. | |
| 2010/0159679 | A1 | | 6/2010 | Wada et al. | |

FOREIGN PATENT DOCUMENTS

| JP | 2002-134521 | 5/2002 |
| JP | 2003-229370 | 8/2003 |
| JP | 2004-071836 | 3/2004 |

* cited by examiner

*Primary Examiner* — Lex Malsawma
*Assistant Examiner* — Thanh Y Tran
(74) *Attorney, Agent, or Firm* — Greenblum & Bernstein P.L.C.

(57) ABSTRACT

An epitaxial wafer is provided capable of eliminating particles in a device process, particles being generated from a scratch in a boundary area between a rear surface and a chamfered surface of a wafer. The scratch in the boundary area between the rear surface and the chamfered surface is removed in a scratch removal process. Thus, no particles exist caused by a scratch, at a time of immersion in an etching solution in the device process, and thus a device yield is increased.

3 Claims, 5 Drawing Sheets

METHOD FOR MANUFACTURING EPITAXIAL WAFER

BACKGROUND OF THE INVENTION

1. Field of the Invention

The present invention relates to a method of manufacturing an epitaxial wafer, more specifically, a method of manufacturing an epitaxial wafer in which a circular susceptor is used and an epitaxial film is grown on a front surface of the wafer in a vapor-phase epitaxial method.

2. Description of Related Art

With increasing wafer diameter these days, a single-wafer type vapor-phase epitaxial growth apparatus is widely used, in order to grow an epitaxial film on a front surface of a silicon wafer. In a single-wafer type apparatus, a silicon wafer is first placed on a susceptor installed in a passageway-shaped reactor (chamber). Subsequently, when being heated by a heater provided external to the reactor, the silicon wafer is reacted with a variety of source gases (raw material gas and reactive gas), which pass through the reactor. Thereby, an epitaxial film is grown on a wafer front surface. A widely used susceptor has a circular shape from a plan view, on which a single wafer is mountable. The type of susceptor is used in order to evenly heat a wafer having a large diameter, such as, for example, a circular silicon wafer having a diameter of 300 mm, and to supply source gas on an entire wafer front surface; and thereby to evenly grow an epitaxial film. A wafer housing portion having a recess shape is provided in a middle portion of an upper surface of the susceptor, so as to house a silicon wafer having front and rear surfaces positioned horizontally. A recent susceptor generally supports a silicon wafer in a boundary area with a chamfered surface of a rear surface of the silicon wafer (for example, Related Art 1). In order to provide a wafer supporting position in the boundary area, one method is to evenly reduce a thickness of a middle portion of a bottom plate of the wafer housing portion, and thereby to provide a step around an external peripheral portion of the bottom plate. The other method is to cut out in a circular shape the middle portion of the bottom plate of the wafer housing portion, and thereby to provide the bottom plate having a ring shape. The boundary area means an area of less than 1 mm internally and externally in a direction of a wafer radius, centering a boundary line with the chamfered surface of the rear surface of the silicon wafer.

Silicon carbide (SiC) has conventionally been employed as material of a susceptor front surface. Thus, the susceptor has a greater hardness than the silicon wafer (Vickers hardness: SiC=2,200 to 2,500 HV; Si=1,050 HV). Further, the susceptor has a higher coefficient of thermal expansion than the silicon wafer, as the coefficient of thermal expansion of SiC is $4.8 \times 10^{-6}$/k and that of silicon is $2.5 \times 10^{-6}$/k. The boundary area of the wafer rear surface and an upper edge of an internal periphery of the external peripheral portion of the bottom plate of the wafer housing portion are in friction at a time of epitaxial growth, when a temperature inside the chamber is high. Due to the difference in the coefficient of thermal expansion, scratches are caused at the time in the boundary area of the silicon wafer, which is softer than the susceptor. The scratch has a groove-like shape similar to a hangnail caused in a portion that rims a base of a nail (hangnail injury). A planar shape of the scratch is a line, a dot, and the like. A cross-sectional shape thereof is a V-shaped notch and the like.

Related Art 1: Japanese Patent Laid-open Publication No. 2003-229370

With microprocessing in a device process, however, problems described below occur when scratches exist on the rear surface of the silicon wafer in the boundary area between the chamfered surface and the wafer rear surface. Specifically, when the silicon wafer is immersed in an etching solution and the like in the device process, particles are generated from the scratched portion. The particles then move to a front surface (device formed surface) side of the wafer, and are deposited on the wafer front surface. Thus, a yield in the device process is reduced.

SUMMARY OF THE INVENTION

The present invention provides a method of manufacturing an epitaxial wafer, the method being capable of manufacturing an epitaxial wafer free from a scratch in a boundary area with a chamfered surface on a rear surface of a semiconductor wafer, and thus capable of preventing generation of particles caused by the scratch in a device process. Further, the present invention provides a method of manufacturing an epitaxial wafer, the method allowing easy removal of a scratch. Furthermore, the present invention provides a method of manufacturing an epitaxial wafer, the method allowing removal of a scratch without being left behind, even when the scratch hypothetically exists in a portion of a chamfered surface of a boundary area on a rear surface of a semiconductor wafer.

A first aspect of the invention provides a method of manufacturing an epitaxial wafer, including growing an epitaxial film on a front surface of a semiconductor wafer in a vapor-phase epitaxial method; and removing a scratch having a depth of 0.5 μm or greater and a length of 1 μm or greater, the scratch being generated in the epitaxial growth, in a boundary area with a chamfered surface of a rear surface of the semiconductor wafer.

According to the first aspect of the invention, the epitaxial film is grown on the front surface of the semiconductor wafer in the vapor-phase epitaxial method. At the time, the scratch (hangnail injury) having the depth of 0.5 μm or greater and the length of 1 μm or greater is generated in the boundary area with the chamfered surface of the rear surface of the semiconductor wafer. The scratch is generated because, when the semiconductor wafer is supported by a susceptor, for example, an upper edge of an internal periphery of an external peripheral portion of a bottom plate of a wafer housing portion of the susceptor comes in contact with the boundary area of the wafer rear surface. In the subsequent scratch removal, the scratch generated in the boundary area is removed from the obtained epitaxial wafer. Thereby, the epitaxial wafer is provided having no scratch in the boundary area with the chamfered surface of the rear surface of the semiconductor wafer. As a result, when the epitaxial wafer is immersed in treatment solutions, such as, for example, an etching solution and the like, in a device process thereafter, no particles are generated from a scratch, move to the wafer front surface side, and are deposited on the wafer front surface. Thus, no defects are caused in devices, and thereby a device yield can be increased.

A monocrystalline silicon wafer, a polycrystalline silicon wafer, and the like can be employed as the semiconductor wafer. A diameter of a silicon wafer may be determined as desired, such as, for example, 150 mm, 200 mm, or 300 mm or larger. Silicon same as the wafer (monocrystalline silicon and polycrystalline silicon) can be employed as material of the epitaxial film. Alternatively, material different from the wafer may be used, such as, for example, gallium, arsenic, and the like. A thickness of the epitaxial film is a few μm to 150 μm for bipolar devices and power devices, and 10 μm or less for MOS devices.

Examples of the vapor-phase epitaxial method may include an atmospheric vapor-phase epitaxial method, a reduced-pressure vapor-phase epitaxial method, an organic metal vapor-phase epitaxial method, and the like. In the vapor-phase epitaxial method, for example, a susceptor is used to house an epitaxial wafer laterally (a state in which front and rear surfaces are placed horizontally) in a wafer housing portion, the susceptor having a circular shape from a plan view and being mountable with a single wafer. When the wafer is housed, the upper edge of the internal periphery of the external peripheral portion of the bottom plate of the wafer housing portion of the circular susceptor comes in contact (line contact) with the boundary area between the rear surface and the chambered surface of the epitaxial wafer. The annular contact line is a wafer supporting line.

The boundary area between the rear surface and the chambered surface of the semiconductor wafer herein means a band-shaped area having a width of less than 1 mm internally and externally, a total of less than 2 mm, in a direction of a wafer radius, centering a boundary line between the flat rear surface and the curved chamfered surface of the semiconductor wafer (forming a circle centering the wafer center). It is preferable that the width be approximately 0.1 mm internally and externally, a total of approximately 0.2 mm. Silicon carbide, for instance, may be employed as material of a susceptor front surface. It is preferable to employ a material different from the semiconductor wafer for the material of the susceptor front surface. Thereby, the semiconductor wafer and the susceptor are prevented from melting and integrally adhering to each other due to heating at the time of epitaxial growth. Employing different materials for the semiconductor wafer and the susceptor results in different coefficients of thermal expansion.

The scratch is a cut having a depth of 0.5 μm or greater and a length of 1 μm or greater. In other words, the scratch is like a groove similar to a hangnail caused in a portion that rims a base of a nail (hangnail injury). A planar shape of the scratch is a line, a dot, and the like. A cross-sectional shape thereof is a V-shaped notch and the like. When a size of the scratch is less than 0.5 μm in depth and less than 1 μm in length, the number of particles is small even when particles are generated from the scratch at the time of immersion in an etching solution in the device process, and thus the particles are melted out in the etching solution. Thereby, it is unlikely that the particles move to the wafer front surface side and are deposited on the wafer front surface, and thus that the device yield is decreased due to the scratch. The size of frequently occurred scratches (hangnail injuries) on the wafer rear surface is 0.5 to 5 μm in depth and 5 to 100 μm in length.

A second aspect of the invention provides the method of manufacturing the epitaxial wafer according to the first aspect, wherein, in the scratch removal, the scratch is removed by polishing the rear surface.

According to the second aspect of the invention, the scratch is easily removed since the scratch is removed by polishing.

The polishing herein may be double-side polishing in which both front and rear surfaces of the epitaxial wafer are polished simultaneously by a double-side polisher, or polishing in which only the wafer rear surface on which the scratch exists can be polished by a single-side (rear surface) polisher. Double-side polishing is preferable, since a scratch or contamination may occur on the wafer front surface (front surface of the epitaxial film) when the wafer front surface is held in use of the single-side polisher. Examples of the double-side polisher used for double-side polishing may include a planetary gear double-side polisher having a sun gear and an internal gear, and a sun gearless double-side polisher having no sun gear. The sun gearless double-side polisher is preferable, since a scratch and the like may occur on the wafer front surface due to dust generation from the sun gear.

A third aspect of the invention provides the method of manufacturing the epitaxial wafer according to the first aspect, wherein, in the scratch removal, the scratch is removed by etching the rear surface.

According to the third aspect of the invention, the scratch is easily removed since the scratch is removed by etching. Further, even when the scratch hypothetically exists in the chamfered surface (curved surface) of the boundary area, the scratch can be removed without being left behind.

The etching may be either wet etching or dry etching. In order to prevent deterioration of flatness after polishing, the entire rear surface of the wafer needs to be etched. Wet etching is thus preferable. Wet etching may be acid etching that uses an acid etching solution, or alkaline etching that uses an alkaline etching solution. Acid etching is preferable, however, due to high reactivity with silicon, which leads to high productivity. With respect to a contact condition of the solution to the wafer rear surface in wet etching, dip etching may be employed, in which an entirety of the epitaxial wafer is immersed in the etching solution. Alternatively, a single-side (rear surface) etching may be employed in which the etching solution is contacted only on one side of the semiconductor wafer. An examples of a single-side etching apparatus may be a spray-type etching apparatus, which sprays an etching solution from a spray nozzle. Alternatively, a jet-type etching apparatus may be employed, in which an etching solution is poured into a cup-shaped container to the brim, the rear surface of the semiconductor wafer is contacted on a liquid surface while the semiconductor wafer is being rotated, and thereby only the wafer rear surface is etched.

Examples of a dry etching apparatus may include a plasma etching apparatus, a reactive ion etching apparatus, a reactive ion beam etching apparatus, an ion beam etching apparatus, a photo-excited etching apparatus, and the like. Among the above-listed all etching apparatuses for dry etching and wet etching, the spray-type etching apparatus is optimal in view of flatness after etching and productivity.

According to the first aspect of the invention, the scratch having the depth of 0.5 μm or greater and the length of 1 μm or greater, which is generated in the epitaxial growth in the boundary area with the chamfered surface of the wafer rear surface, is removed in the subsequent scratch removal. Thus, the epitaxial wafer can be produced having no scratch in the boundary area. As a result, when the epitaxial wafer is immersed in treatment solutions, such as, for example, an etching solution and the like, in the device process thereafter, no particles are generated from a scratch, move to the wafer front surface side, and are deposited on the wafer front surface. Thus, no defects are caused in devices, and thereby the device yield can be increased.

According to the second aspect of the invention, the scratch is easily removed since the scratch is removed by polishing the wafer rear surface.

According to the third aspect of the invention, the scratch is easily removed since the scratch is removed by etching the wafer rear surface. Further, even when the scratch hypothetically exists in the chamfered surface of the boundary area, the scratch can be removed without being left behind.

10 Epitaxial wafer
11 Silicon wafer (semiconductor wafer)
12 Epitaxial film
a Boundary area
b Scratch

DETAILED DESCRIPTION OF PREFERRED EMBODIMENTS

The embodiments of the present invention are specifically explained below. The first embodiment is first explained with reference to FIGS. 1 to 6.

First Embodiment

Figure 1:
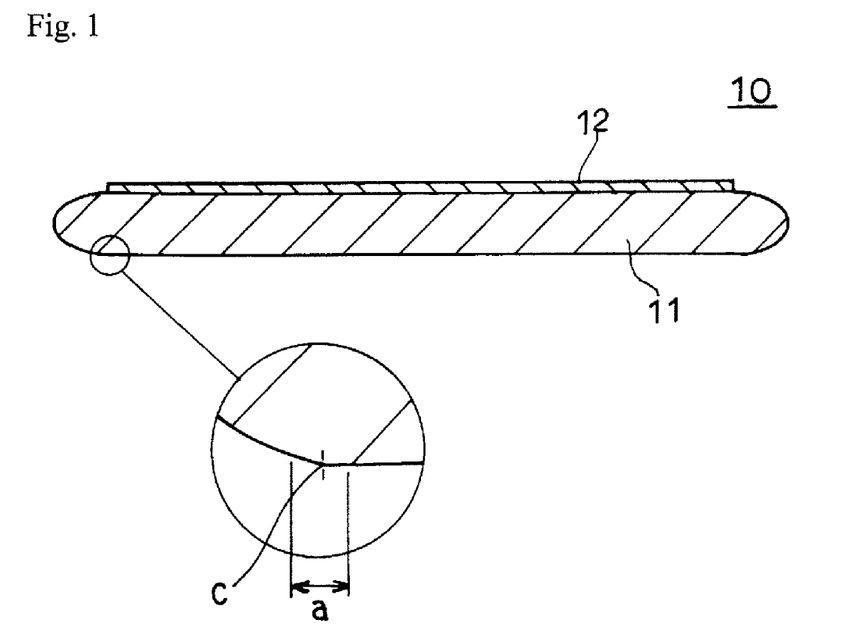
FIG. 1 is an enlarged vertical cross-sectional view of an epitaxial wafer obtained in a method of manufacturing an epitaxial wafer according to a first embodiment of the present invention.
Figure 2:
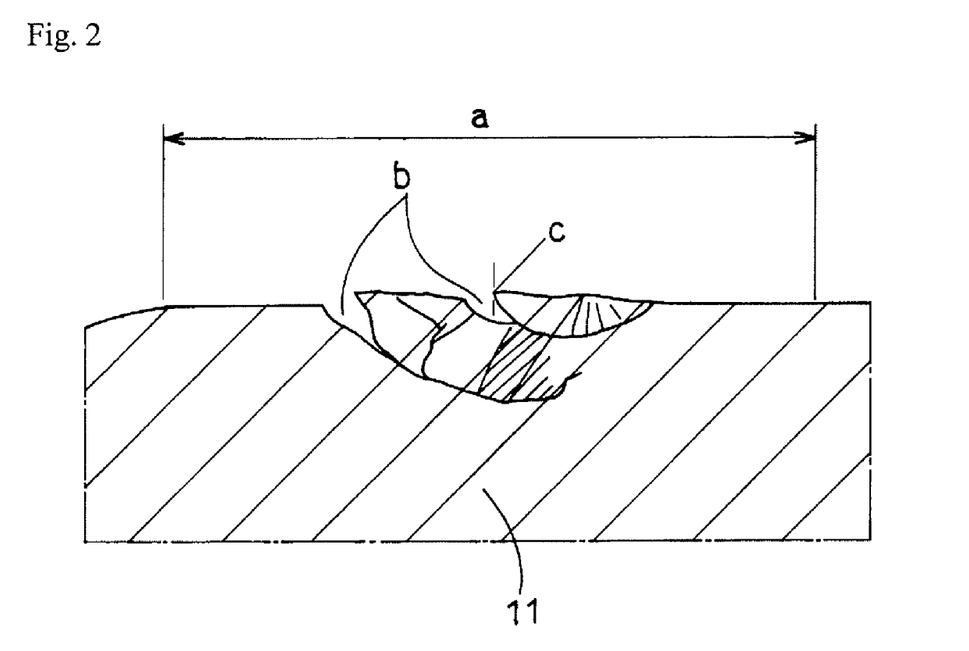
FIG. 2 is an enlarged vertical cross-sectional view of a scratch on the epitaxial wafer obtained in the method of manufacturing the epitaxial wafer according to the first embodiment of the present invention.

FIG. 1 shows an epitaxial wafer 10 according to the first embodiment of the present invention. An epitaxial film 12 is grown on a front surface of a silicon wafer (semiconductor wafer) 11 of the epitaxial wafer 10. No scratch b exists in a boundary area a with a chamfered surface of a rear surface of the silicon wafer 11 (FIG. 2). The boundary area a herein is an area having a ring band shape of 0.1 mm inward and 0.1 mm outward in a radius direction of the wafer, centering a boundary line c between the rear surface and the chamfered surface of the silicon wafer 11 (circle formed as a flat surface and a curved surface are contacted). The scratch b is a cut scratch generated in the boundary area with the chamfered surface of the wafer rear surface, the scratch having a depth of 0.5 μm or greater and a length of 1 μm or greater.

Figure 3:
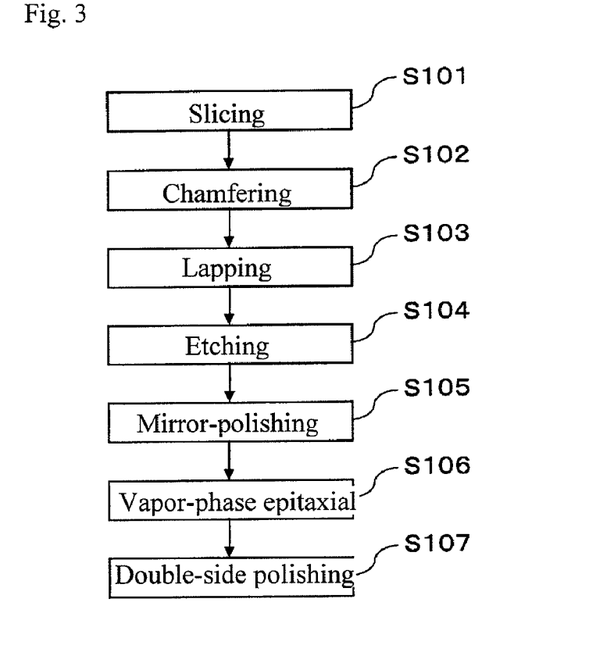
FIG. 3 is a flow sheet illustrating the method of manufacturing the epitaxial wafer according to the first embodiment of the present invention.

A method of manufacturing the epitaxial wafer 10 is explained below with reference to a flow sheet of FIG. 3. The silicon wafer 11 is first prepared by slicing a monocrystalline silicon ingot pulled in the CZ process (S101). The silicon wafer 11 is added with boron as a dopant, until a specific resistance of the silicon wafer 11 reaches 10 mΩ·cm.

The silicon wafer 11, which is sliced into a thickness of about 900 μm and a diameter of 300 mm, is then chamfered in a peripheral edge portion thereof by a grind stone for chamfering in a chamfering process (S102). Thereby, the peripheral edge portion of the silicon wafer 11 has predetermined roundness from a cross-sectional view. In a subsequent lapping process, the chamfered silicon wafer 11 is lapped by a lapping machine (S103). In an etching process thereafter, the lapped wafer is immersed in a predetermined etching solution (mixed acid, or alkali+mixed acid), and thereby deformation in the lapping process, chamfered process, and the like is removed (S104). In this case, etching is performed for about 20 μm on one side and about 40 μm on both sides. Thereafter, the silicon wafer 11 is fixed to a polishing plate, and then mirror-polished (S105).

Figure 4:
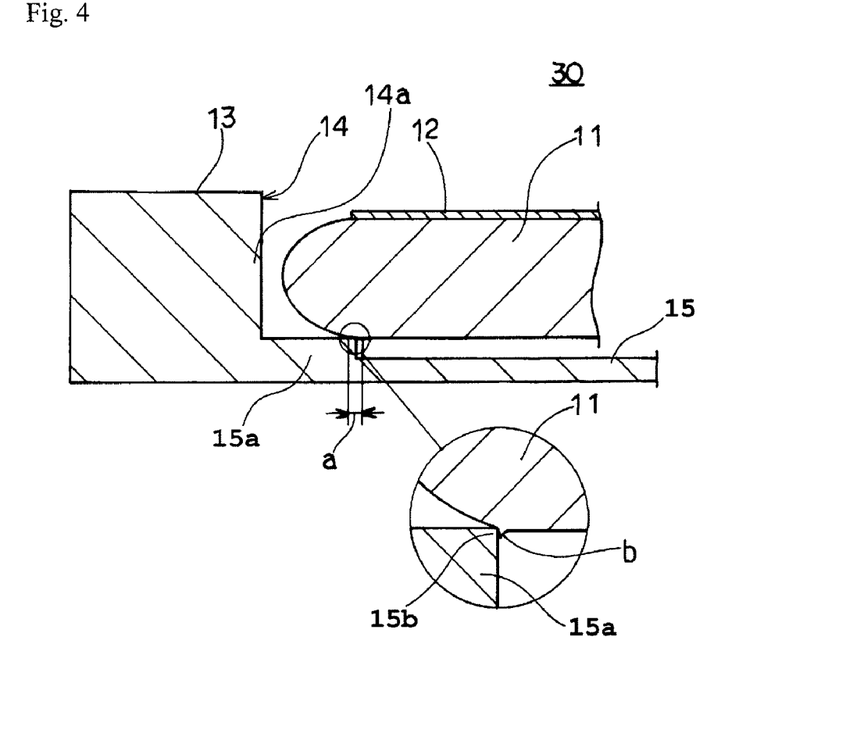
FIG. 4 is an enlarged cross-sectional view of a main portion of a vapor-phase epitaxial growth apparatus used in the method of manufacturing the epitaxial wafer according to the first embodiment of the present invention.

Subsequently, the silicon wafer 11 is placed in a reaction chamber of a single-wafer type vapor-phase epitaxial growth apparatus. Then, the epitaxial film 12 is grown on the front surface of the silicon wafer 11 in a vapor-phase epitaxial method (S106). The epitaxial growth process using the vapor-phase epitaxial growth apparatus is specifically explained below with reference to FIG. 4. As shown in FIG. 4, a vapor-phase epitaxial growth apparatus 30 has a susceptor 13 provided horizontally in a middle portion of a chamber to which heaters are provided above and below (not shown in the drawing), the susceptor 13 having a circular shape from a plan view. Material of a front surface of the susceptor 13 is silicon carbide (Vickers hardness of 2,300 HV). A recess-shaped wafer housing portion 14 is provided in a middle portion of the front surface of the susceptor 13, so as to house the semiconductor wafer 11 in a state in which its front and rear surfaces are placed horizontally. A bottom plate 15 of the wafer housing portion 14 has an evenly reduced thickness in a middle portion thereof. Thereby, a step is provided proximate to an upper edge of an internal periphery 15b of an external peripheral portion 15a of the bottom plate 15. The wafer housing portion 14 is a space demarcated by the bottom plate 15 and a peripheral wall 14a provided to a periphery of the external peripheral portion 15a. A pair of gas supply inlets are provided to a first side portion of the chamber to supply a predetermined carrier gas ($H_2$ gas) and a predetermined source gas ($SiHCl_3$ gas) to an upper space of the chamber, such that the gases flow in parallel to the wafer front surface. Further, a gas discharge outlet for the both gases is provided to a second side portion of the chamber.

At the time of epitaxial growth, the silicon wafer 11 is first placed in the wafer housing portion 14 of the susceptor 13, such that the front and rear surfaces of the wafer are provided horizontally. At the time, the upper edge of the internal periphery 15b of the susceptor 13 comes in contact with the boundary area a with the chamfered surface of the rear surface of the silicon wafer 11. The contact is provided along an entire periphery of the silicon wafer 11.

Subsequently, the epitaxial film 12 is grown on the front surface of the silicon wafer 11. Specifically, the carrier gas and the source gas are introduced into the reaction chamber through the corresponding gas supply inlets. An internal pressure of the reaction chamber is set to 100±20 KPa. Then, silicon, which is produced through pyrolysis or reduction of the source gas, is deposited at a reaction rate of 1.5 to 4.5 μm/minute, on the silicon wafer 11 heated to a high temperature of 1,000° C. to 1,300° C. Thereby, the epitaxial film 12 of monocrystalline silicon is grown on the front surface of the silicon wafer 11. Thus, the epitaxial wafer 10 is produced. At the time of heating in the epitaxial growth, the boundary area a of the rear surface of the silicon wafer 11 is in friction with the upper edge of the internal periphery 15b of the susceptor 13, due to difference in a coefficient of thermal expansion between the silicon wafer 11 and the susceptor 13. Front surface material of the susceptor 13 is silicon carbide, which is harder than the silicon wafer 11. Thus, the scratch b having a depth of 0.5 to 20 μm and a length of 1 to 500 μm is generated in the boundary area a between the chamfered surface and the wafer rear surface on the rear side of the wafer external peripheral portion.

The epitaxial wafer 10 is subsequently placed in a double-side polisher having a sun gearless structure. The front surface of the epitaxial wafer 10 (front surface of the epitaxial film 12) is then mirror-polished. Concurrently, the rear surface of the epitaxial wafer 10 (rear surface of the silicon wafer 11) is polished at a higher polishing rate than in the front surface polishing (S107). A polishing solution used herein has a silica concentration of 0.3 weight % or less.

Figure 5:
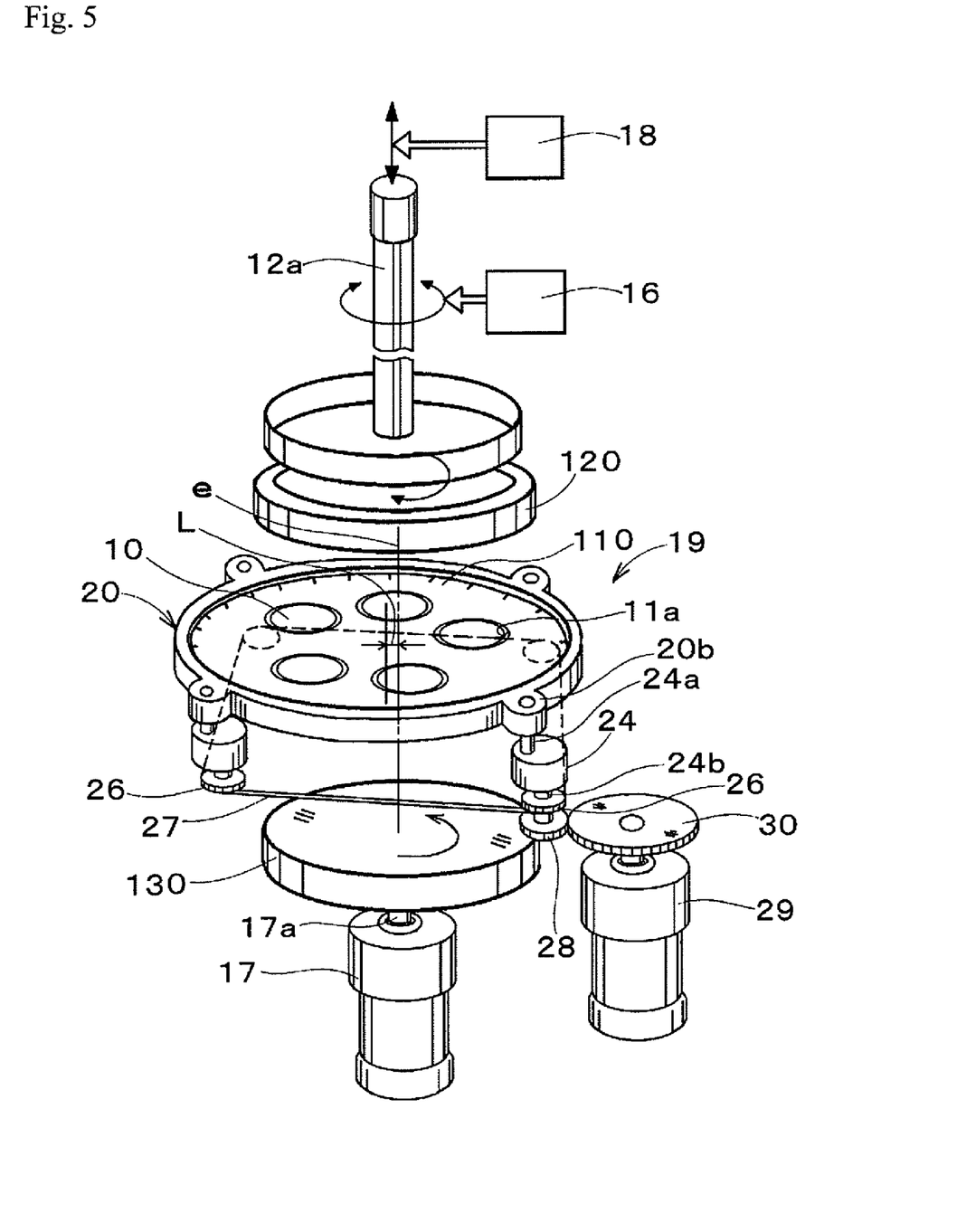
FIG. 5 is an exploded perspective view of a sun gearless double-side polisher used in the method of manufacturing the epitaxial wafer according to the first embodiment of the present invention.
Figure 6:
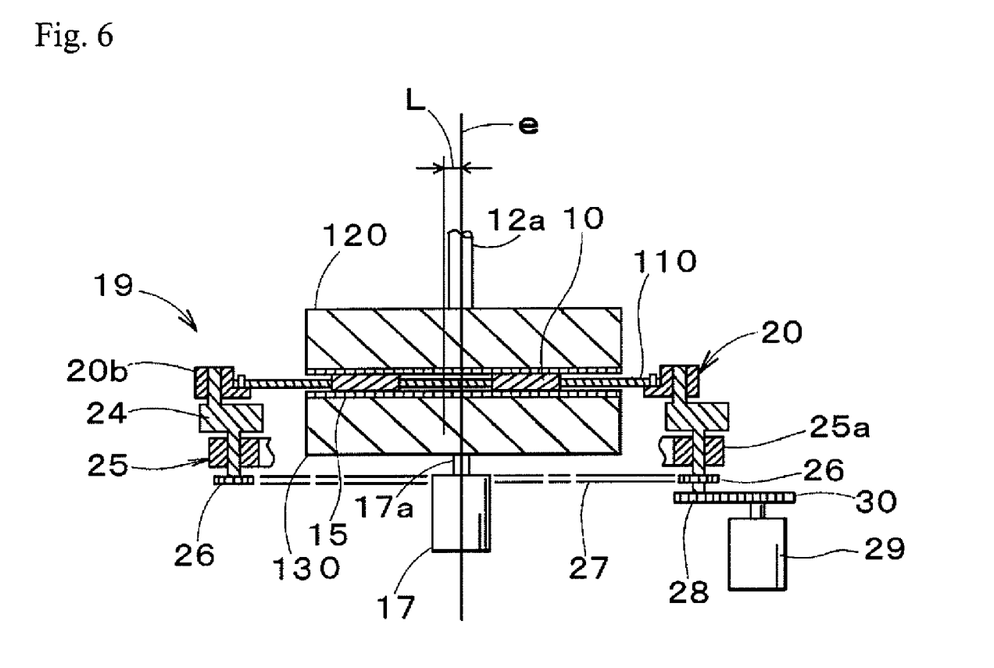
FIG. 6 is a vertical cross-sectional view when both sides of the epitaxial wafer are being polished using the double-side polisher according to the first embodiment of the present invention.

A structure of the double-side polisher having the sun gearless structure is specifically explained below with reference to FIGS. 5 and 6. As shown in FIGS. 5 and 6, an upper platen 120 is rotated and driven within a horizontal surface, by an upper rotation motor 16 via a rotation axis 12a extended upward. Further, the upper platen 120 is vertically moved up and down by a lift 18, which moves the upper platen 120 in an axial direction. The lift 18 is used to supply and eject the epitaxial wafer 10 to and from a carrier plate 110. A pressure from the upper platen 120 and a lower platen 130 to the front and rear surfaces of the epitaxial wafer 10, respectively, is applied by pressuring devices, such as air bags, and the like (not shown in the drawing) provided respectively within the upper platen 120 and the lower platen 130. The lower platen 130 is rotated within a horizontal surface by a lower rotation motor 17 via an output axis 17a thereof. A carrier circular motion mechanism 19 causes the carrier plate 110 to perform a circular motion within a surface parallel to a front surface of the plate 110 (horizontal surface), such that the plate itself is not rotated.

The carrier circular motion mechanism 19 has an annular carrier holder 20 that externally holds the carrier plate 110. The carrier circular motion mechanism 19 and the carrier holder 20 are connected via an interlock structure. Four axis receivers 20b are provided to an external peripheral portion of the carrier holder 20, the axis receivers 20b being projected externally and being provided every 90 degrees. Each of the axis receivers 20b is inserted and fixed with an eccentric axis 24a, which is extended at an eccentric position on an upper surface of an eccentric arm 24 having a small-diameter circular plate shape. A rotation axis 24b is provided perpendicularly at a central portion of a lower surface of each of the four eccentric arms 24. The rotation axis 24b is inserted and fixed to an axis receiver 25a in a state in which an end portion of the rotation axis 24b is projected downward. A total of four axis receivers 25a are provided every 90 degrees to an annular apparatus main body 25. A sprocket 26 is fixed to the end portion projected downward of each of the rotation axes 24b. A timing chain 27 is continuously provided to the sprockets 26 in a horizontal state. The four sprockets 26 and the timing chain 27 rotate the four rotation axes 24b simultaneously, such that the four eccentric arms 24 perform a circular motion synchronously.

One of the four rotation axes 24b is provided with a longer length, such that the end portion is projected downward further than the sprocket 26. A gear 28 for power transmission is fixed to the projected portion. The gear 28 is engaged with a large-diameter gear 30 for driving fixed to the output axis extended upward of a circular motion motor 29.

Thus, when the circular motion motor 29 is activated, a rotation force thereof is transmitted to the timing chain 27, by way of the gears 30 and 28, and the sprocket 26 fixed to the long rotation axis 24b. Then, circumferential rotation of the timing chain 27 synchronously rotates via the remaining three sprockets 26, the four eccentric arms 24 centering the rotation axes 24b within the horizontal surface. Thereby, the carrier holder 20 integrally connected to the eccentric axes 24a, and thus the carrier plate 110 held by the holder 20 perform a circular motion involving no rotation, within the horizontal surface parallel to the plate 110. In other words, the carrier plate 110 circles while being held in an eccentric state having a distance L from an axial line e of the upper platen 120 and the lower platen 130. The distance L is identical to a distance between the eccentric axis 24a and the rotation axis 24b. The circular motion involving no rotation allows all points on the carrier plate 110 to follow a trajectory of a same-size small circle.

Polishing the both sides of the epitaxial wafer 10 as described above increases the flatness of the both surfaces of the wafer. Further, when only the wafer rear surface on which a scratch exists is polished, it is less likely that a scratch or contamination occurs on the wafer front surface (front surface of the epitaxial film), since the wafer front surface is held.

The processes above produce the epitaxial wafer 10 having no scratch b on the boundary area a with the chamfered surface of the rear surface of the silicon wafer 11 (FIG. 1). Thus, even when the epitaxial wafer 10 is immersed in treatment solutions, such as, for example, an etching solution and the like, in a subsequent device process, no particles are generated from the scratch b. Accordingly, no particles move to the wafer front surface side and are deposited on the wafer front surface. Thereby, a device yield can be increased. In addition, since the scratch b is removed by polishing the wafer rear surface in the first embodiment, the scratch b is easily removed.

Figure 7:
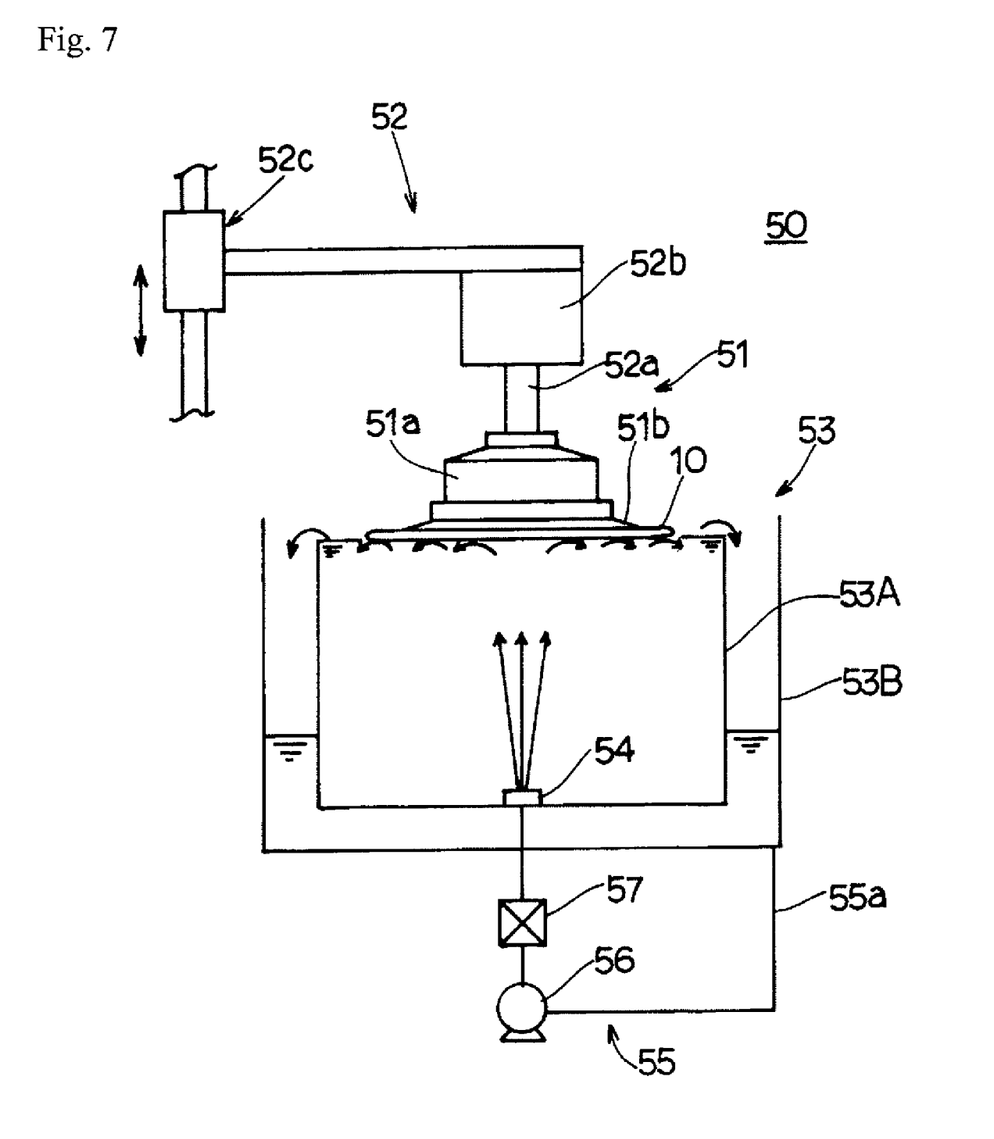
FIG. 7 is a cross-sectional view of a jet-type etching apparatus used in a method of manufacturing an epitaxial wafer according to a second embodiment of the present invention.

A method of an epitaxial wafer according to the second embodiment of the present invention is explained below with reference to FIG. 7. The second embodiment features employment of etching (scratch removal process) in which a jet-type etching apparatus (single-side etching apparatus) 50 is used in the scratch removal process to contact an etching solution on a wafer rear surface, and thereby to remove a scratch b. The rear surface etching process (scratch removal process) by the jet-type etching apparatus 50 is specifically explained below with reference to FIG. 7.

The jet-type etching apparatus 50 has an etching tank 53, a wafer holder 51, and a wafer rotator/lift 52. The etching tank 53 holds an etching solution ($HF:NH_4F=2:1$) to a tank upper portion. The wafer holder 51, which is provided above the etching tank 53, vacuum sucks an epitaxial wafer 10 in a horizontal state having a wafer rear surface facing downward. The wafer rotator/lift 52 horizontally rotates and moves up and down the epitaxial wafer 10 held by the wafer holder 51, and the wafer holder 51 integrally.

The etching tank 53 includes an internal tank 53A and an external tank 53B, which are provided separately. A blow-off nozzle 54 is provided to a central portion of a bottom surface of the internal tank 53A, the blow-off nozzle 54 blasting out the etching solution immediately above and elevating a liquid surface to a predetermined height. A liquid circulator 55 is connected to the blow-off nozzle 54 via a circulation pipe 55a. The liquid circulator 55 directs the etching solution overflown from the internal tank 53A and discharged to the external tank 53B, filters the etching solution, and returns the solution from the blow-off nozzle 54 to the internal tank 53A. A circulation pump 56 and a foreign object removal filter 57 are connected to the circulation pipe 55a.

The wafer holder 51 is provided with a holder main body 51a and a lower surface thereof, the holder main body 51a having a thick circular disc shape. The wafer holder 51 has a suction plate 51b provided with a plurality of suction holes at predetermined pitches. The epitaxial wafer 10 is sucked to a lower surface of the suction plate 51b. The holder main body 51a is provided with a suction port, to which an end portion of a suction hose is connected, the suction hose being derived from a suction portion of a vacuum apparatus (not shown in the drawing). The holder main body 51a has an internal flow path connecting the suction port and each of the suction holes of the suction plate 51b. The wafer rotator/lift 52 has a rotation motor 52b and a lift mechanism 52c. The rotation motor 52b has an output axis 52a having a downward end. The lift mechanism 52c moves up and down the rotation motor 52b. The wafer holder 51 is connected to a lower end portion of the rotation axis 52a.

A single-side etching method according to the second embodiment is explained below. As shown in FIG. 7, the vacuum apparatus (not shown in the drawing) is activated in advance so as to generate a negative pressure, which sucks and holds the epitaxial wafer 10 to the lower surface of the suction plate 51b. At the time, the wafer rear surface faces downward. Then, while being rotated by the rotation motor 52b at a speed of 1 to 10 rpm, the epitaxial wafer 10 is moved downward by the lift mechanism 52c and held at a height of 5 to 30 mm from the liquid surface.

Subsequently, an etching solution is blasted out by the circulation pump 56 from the blow-off nozzle 54 to the surface of the etching solution at 5 to 30 liter/minute. Thus, the liquid surface in a central portion of the etching solution in the internal tank 53A is elevated by 5 to 30 mm. Accordingly, the elevated portion is contacted with the central portion of the rear surface of the silicon wafer 11 held horizontally above the liquid surface. A surface tension of the etching solution spreads and drops the etching solution to an entire area of one surface (rear surface) of the silicon wafer 11. Thereby, the entirety of the wafer rear surface including the scratch b in the boundary area a is etched. Since the scratch b is removed by etching as described above, the scratch b is more easily removed than in the polishing of the first embodiment. In addition, even when the scratch b is hypothetically generated in the chamfered surface portion of the boundary area a, the scratch b can be removed without being left behind. Other structures, functions, and effects are similar to those of the first embodiment, and thus explanations thereof are omitted.

Test results are reported below in which occurrence of scratches is measured when immersion in the etching solution in the device process is assumed, with respect to the epitaxial wafer actually produced in the first embodiment (present invention product) and an epitaxial wafer manufactured in a conventional method (hereinafter referred to as a conventional product). Measured values are average values obtained in tests of 25 pieces, each of the epitaxial wafers of the first embodiment and the conventional epitaxial wafers. The number of scratches existing in the boundary area with the chamfered surface of the epitaxial wafer rear surface is counted (minimum measurement size: 0.2 μm) by using a detector of the wafer rear surface and end surface (manufactured by Raytex Corporation). As a result, the number of scratches of the present invention product is 0, and the number of scratches of the conventional product is about 60. It is thus demonstrated that the epitaxial wafer obtained in the manufacturing method of the first embodiment is superior to the conventional product.

The present invention is effective in manufacturing of epitaxial wafers to be used as substrates of MOS products, logic products, and the like.

What is claimed is:

1. A method of manufacturing an epitaxial wafer, comprising:
    growing an epitaxial film on a front surface of a semiconductor wafer in a vapor-phase epitaxial method; and
    removing a scratch having a depth of 0.5 μm or greater and a length of 1 μm or greater, the scratch being generated in the epitaxial growth, in a boundary area with a chamfered surface of a rear surface of the semiconductor wafer.

2. The method of manufacturing the epitaxial wafer according to claim 1, wherein, in the scratch removal, the scratch is removed by polishing the rear surface.

3. The method of manufacturing the epitaxial wafer according to claim 1, wherein, in the scratch removal, the scratch is removed by etching the rear surface.

* * * * *